United States Patent [19]
Hsu

[11] Patent Number: 4,636,653
[45] Date of Patent: Jan. 13, 1987

[54] HIGH VOLTAGE SEMI-CONDUCTOR SWITCHING APPARATUS AND METHOD

[76] Inventor: Poh S. Hsu, 1010 Massachusetts Ave., Cambridge, Mass. 02138

[21] Appl. No.: 705,846

[22] Filed: Feb. 26, 1985

Related U.S. Application Data

[63] Continuation of Ser. No. 389,238, Jun. 17, 1982, abandoned.

[51] Int. Cl.$^4$ .................... H03K 17/60; H03K 17/72
[52] U.S. Cl. ............................ 307/253; 307/252 C; 361/91; 357/36; 357/48; 357/55
[58] Field of Search ............... 307/252 C, 253, 254, 307/303; 361/91; 357/36, 48, 55, 47

[56] References Cited

U.S. PATENT DOCUMENTS

| | | | |
|---|---|---|---|
| 3,628,059 | 12/1971 | Niu | 307/362 |
| 4,125,787 | 11/1978 | Ohhinata et al. | 307/253 |
| 4,195,240 | 3/1980 | Otofuji | 307/362 |

OTHER PUBLICATIONS

Jackson et al., "Effects of Emitter-Open Switching on the Turn Off Characteristics of High-Voltage Power Transistors", IEEE, 1980.
Chen et al., "Application of Transistor Emitter-Open Turn-Off Scheme to High Voltage Power Inverters", IEEE, 1981.
Skanadore, "A New Bipolar High Frequency Power Switching Technology Eliminates Load-Line Shaping", Powercon 7 Conference, 1980.
Farrow et al., "A 300 kHz Off-Line Switching Supply Using a Unique Bi-MOS Switch Combination", PCI, Sep./Oct. 1980.

*Primary Examiner*—John Zazworsky
*Attorney, Agent, or Firm*—Rines and Rines, Shapiro and Shapiro

[57] ABSTRACT

This disclosure is concerned with a novel technique for achieving higher switching speeds than emitter-open switching, with lower forward voltage drops particularly for very high current applications and at lower cost, and with freedom from reverse biased secondary breakdown, through utilizing a relatively standard base drive configuration for the bipolar transistor, GTO or similar semi-conductor switching device(s) but with the connection of a diode from the emitter to ground, with the diode cathode being grounded, and with a high base drive which, together with low inductance in the connection between the emitter and the diode anode ensures against forward biasing of the diode during the turn-off period.

18 Claims, 17 Drawing Figures

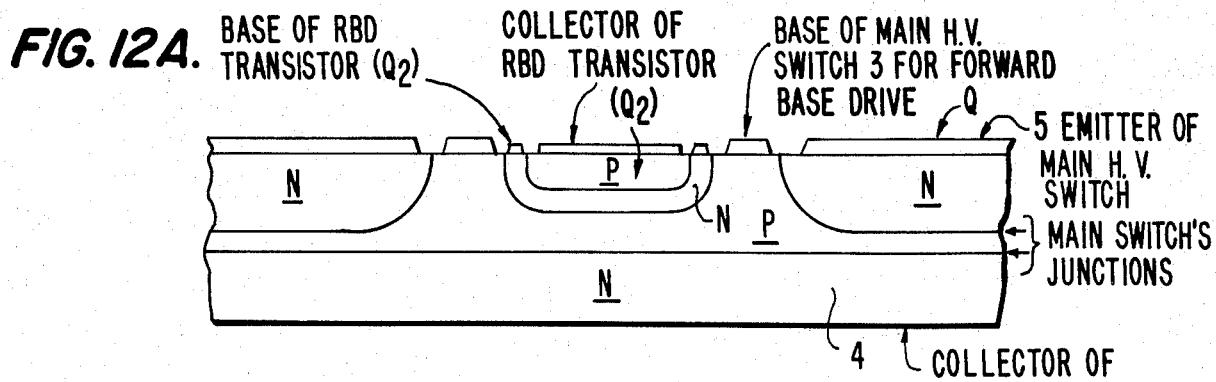
FIG. 12A.
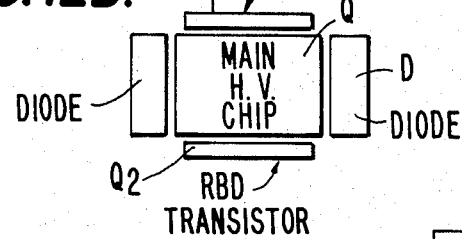
FIG. 12B.
FIG. 13.
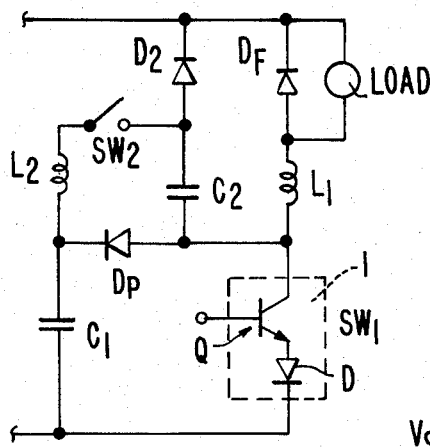
FIG. 14.
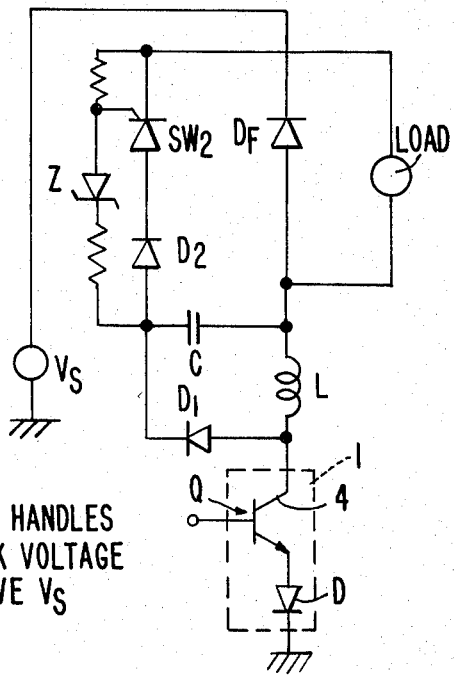
FIG. 15.
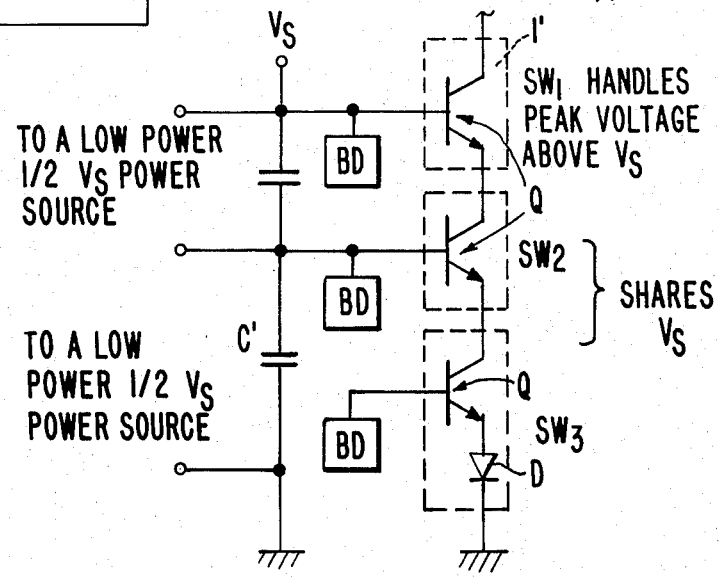

HIGH VOLTAGE SEMI-CONDUCTOR SWITCHING APPARATUS AND METHOD

This is a continuation application of Ser. No. 389,238, filed June 17, 1982, now abandoned.

The present invention relates to high-voltage semi-conductor switching apparatus and methods, being more particularly directed to novel semi-conductor switching configurations and constructions to achieve high switching speeds with low voltage drops and without reverse biased secondary breakdown characteristics.

One of the major failure modes of semi-conductor bipolar transistors is reverse biased secondary breakdown. Gate turn-off devices (GTO) also suffer from reverse biased secondary breakdown. The emitter-open or cascode switch has recently received considerable attention because it offers a means of solving the reverse biased secondary breakdown problem of bipolar transistors, GTOs and the like, generally referred to as semi-conductor switches. Attention is invited, for example, to "Effects of Emitter-Open Switching on the Turn-Off Characteristics of High Voltage Power Transistors" (Chen et al.) PESC, 1980; "Applications of Transistor Emitter-Open Turn-Off Scheme to High Voltage Power Inverters" (Chen et al.) PESC, 1981, "A New Bipolar High Frequency Power Switching Technology Eliminates Load-Line Shaping (Skanadore), Powercon 7, 1980; and "A 300 KHZ Off-Line Switching Supply Using a Unique Bi-Mos Switch Combination" (Farrow) PCI, Sept/Oct 1980.

The emitter-open switch is particularly advantageous for bipolar transistors because, under emitter-open switching, bipolar transistors do not suffer from reverse biased secondary breakdown up to their collector-base voltage with open emitter ($V_{CBO}$) rating. Considering that most high voltage bipolar transistors have $V_{CBO}$ ratings over 100% higher than their $V_{CEO}$ ratings (2N 6547, BUX 48, BUX 98, MJ 16012, etc.), the advantage is obvious when the transistors are used in circuits with large turn-off voltage surges (the flyback converter, for example). The emitter-open switch has another advantage: storage times and current fall times of the high voltage switch are reduced significantly when compared to the next fastest turn-off technique. However, it does call for a low voltage switch which is very fast, and has a small forward voltage drop during conduction. This second requirement arises because the low voltage switch must be series connected with the high voltage switch and will add to the on-state losses of the emitter-open switch. This makes it difficult to achieve a high current emitter-open switch which does not exhibit excessive on-state losses.

The invention is concerned, accordingly, with a new semi-conductor switch which achieves at least the same switching speed as the open-emitter switch, but does not contribute more than, for example, about 0.7 V to the on-state voltage drop when compared to a standard high voltage bipolar transistor or GTO. This is true even for a large current switch, such as of 200 A. The new switch is free from reverse biased secondary breakdown and requires only a drive similar to a standard base drive system for bipolar transistors.

An object of the invention, therefore, is to provide a new and improved high-voltage semi-conductor switching apparatus and method that obviates reverse biased secondary breakdown while achieving higher switching speed than emitter-open switching and lower forward voltage drop, and with standard base drive configurations.

A further object is to provide novel semi-conductor switching apparatus and configurations of more general utility as well.

Other and further objects are explained hereinafter and are more particularly delineated in the appended claims.

In summary, however, from one of its viewpoints, the invention embraces a high-voltage semi-conductor switching apparatus having, in combination, a semi-conductor switch as of the bipolar transistor and GTO types and the like provided with electrodes corresponding to base of control, emitter or cathode and collector or anode electrodes; switching means for driving the base; and diode means the anode of which is connected to the emitter and the cathode of which is grounded to eliminate reverse biased secondary breakdown at turn-off of said semi-conductor switch. Preferred details and best mode embodiments are hereinafter presented.

The invention will now be described with reference to the accompanying drawings in which FIG. 1 is a circuit diagram of a preferred embodiment of the invention operating in accordance with the underlying method thereof with a bipolar transistor switch;

FIGS. 11 and 12A are longitudinal cross sections of further modified constructions embodying a monolithic semi-conductor switching construction;

FIG. 12B is a top elevation of a further modified construction;

FIGS. 13 and 14 are circuit diagrams illustrating the use of the switching circuit of FIG. 1 with substantially lossless turn-on and turn-off snubber circuits for further reducing losses; and FIG. 15 is a circuit diagram of the series connection of several semi-conductor switches of the type shown in FIG. 1 used to achieve higher voltage blocking capability.

Figure 1:
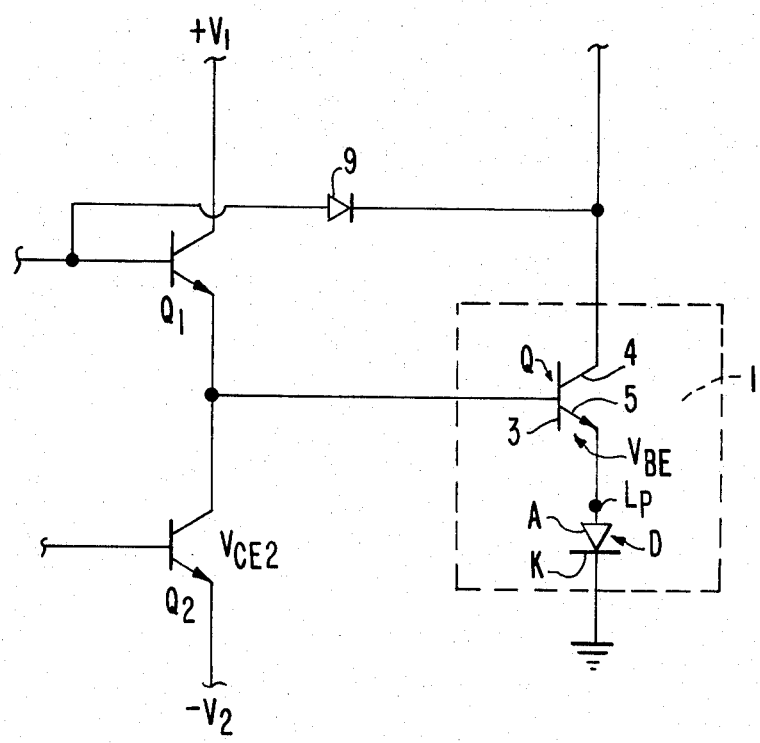
FIG. 1A is a similar circuit (fragmentary) using a GTO in the same fashion.

Referring to the drawings, FIG. 1 shows the new switching apparatus 1 of the invention as applied to a bipolar transistor Q serving as the main switch with a conventional base drive. The new semi-conductor switch comprises the high-voltage bipolar transistor Q and a diode D connected in series with the emitter electrode 5 and having its cathode K grounded and its anode A connected to the emitter. Drive for the base electrode 3 of the transistor Q is simpler than that required for emitter-open switch circuits, requiring only two voltage sources $+V_1$ and $-V_2$. A main difference between a standard base drive and that required by the switch of the invention lies in the need for a very high peak reverse current (greater than or equal to the collector current $I_C$) and a higher than usual negative voltage source $-V_2$ (about 20 V). It is interesting that the addition of a single device (the emitter diode D) can achieve so much advantage. This novel semi-conductor switch 1 operates as follows.

When turn-off is initiated, drive transistor $Q_1$ is turned off, and drive transistor $Q_2$ is turned on. $Q_2$ should be a switch with a very fast rise time. An anti-saturation clamping diode 9 (Dc) is shown connected between the base of the driving transistor $Q_1$ and the collector 4 of the bipolar transistor Q. The reverse base current of Q quickly reaches the current level at collector 4. At this point, $I_D$, the emitter diode current, drops to zero and reverse recovery of the diode D takes place. Transistor Q at this stage is still in quasi-saturation. The collector current $I_C$ remains constant. Hence the reverse base current exceeds the on-state collector current $I_C$ by the reverse recovery current of the diode D, $I_{rr}$. The bipolar transistor Q is experiencing a forced gain of less than 1 at turn off. This helps to speed up the turn-off. Once the diode D has reached the peak reverse current point, the voltage across it reverses quickly. It will remain off so long as the reverse voltage is maintained, which means that the inductive voltage induced in the inductance $L_P$ of the link connecting the emitter 5 of the high voltage switch Q to the diode D is not higher than $V_2 - V_{BE} - V_{CE2}$, shown in FIG. 1. This implies that when the bipolar transistor Q finally reaches theend of the storage phase, no emitter current flows. Hence no current focusing occurs at high dissipation. If the peak voltage ever reaches the breakdown voltage of the device, it will be the collector-base junction which will avalanche, and no secondary breakdown phenomenon should occur. The high reverse base drive voltage $V_2$ together with a very low inductance $L_P$ in the link between the emitter of Q and the diode D ensures that there is no possibility of the emitter diode D being forward biased during the turn-off period. A very high lateral voltage gradient must occur in the base region before the emitter diode D can be forward biased. The emitter diode D also prevents sustained emitter-base avalanche from occurring. This helps to reduce dissipation in Q, and eliminates a source of unnecessary stress for Q.

Figure 2:
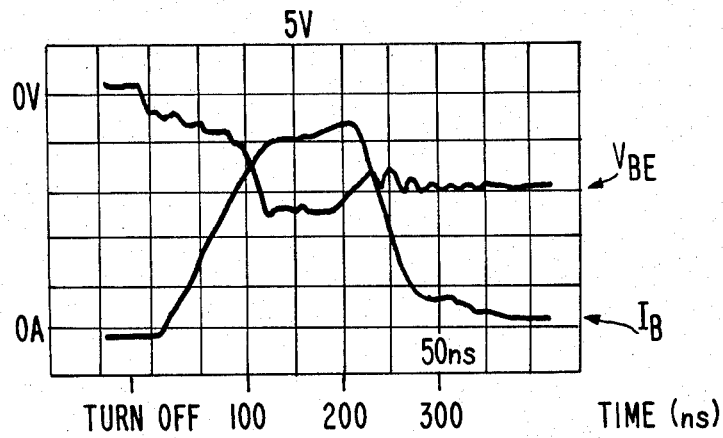
FIGS. 2 through 7 are oscillograms plotting current and voltage characteristics later explained in detail of the circuit of FIG. 1.
Figure 3:
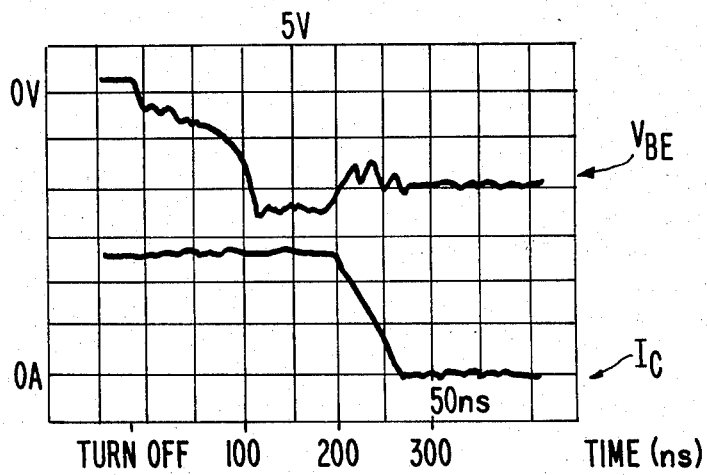

FIGS. 2 to 5 show results obtained with a 1 kW chopper utilizing the switch of FIG. 1 with a Motorola 2N6547 transistor Q and a MR 2404F diode D. FIG. 2 shows the base current $I_B$ and base-to-emitter voltage $V_{BE}$ of Q at turn-off as functions of time. Base current peaks at 9 A. Current rise time for reverse base drive is fast, at 100 nS. In FIG. 3, the collector current $I_C$ and $V_{BE}$ of Q are plotted with time. Storage time $t_s$, is slightly over 200 nS and current fall time $t_{fi}$ is 50 nS. The circuit was snubbered to prevent fast rate of rise of collector voltage, which significantly increased the current fall time. Without snubbers, current fall time approaches 10 nS.

Figure 4:
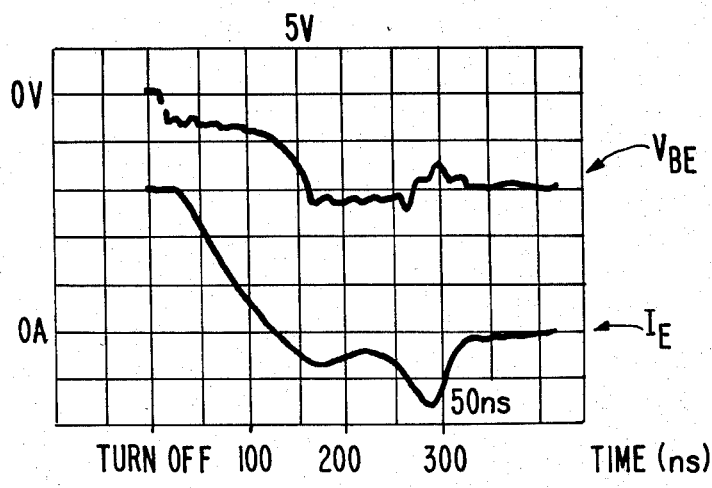
Figure 5:
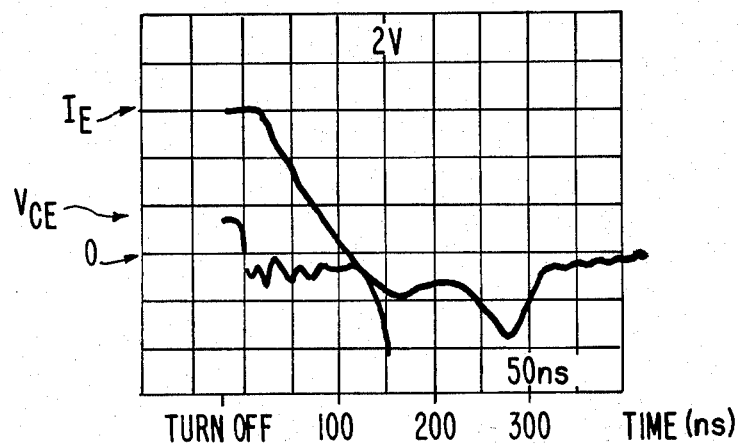

FIG. 4 illustrates the emitter current $I_E$ and $V_{BE}$ of Q with time. The diode D had a reverse recovery time $t_{rr}$ of 200 nS. The high dI/dt caused a fairly large reverse recovery current which can be helpful in reducing the storage time, but also implies that $Q_2$ must be able to handle very high peak currents. In FIG. 5, $V_{CE}$ and $I_E$ are plotted with time, illustrating perhaps the most interesting performance. This graph shows that the collector 4 is negative with respect to the emitter 5 over the whole emitter current fall time, and over part of the reverse emitter current period as well. This means that the whole emitter base junction (even the center of the emitter finger construction) is reverse biased during this period. This helps to ensure that even the center of the emitter fingers are turned off quickly such that there is almost no possibility of current filament formation. This, of course, is not the case with prior art emitter-open switching.

Figure 6:
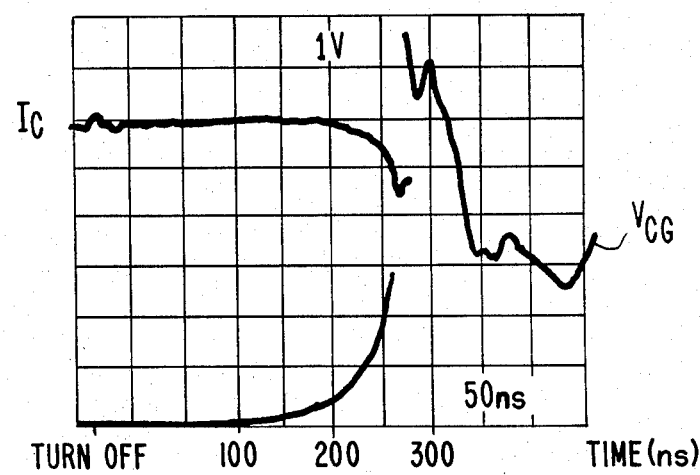
Figure 7:
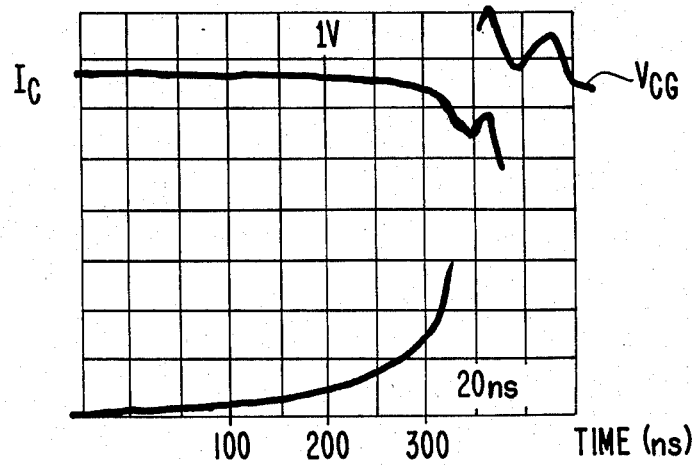

The fact that, in practice, the novel circuit of the invention can handle very high peak currents at high voltage has been demonstrated in further tests the results of which are shown in FIGS. 6 and 7, plotting $I_C$ and $V_{CG}$ (voltage eollector-to-ground) as functions of time. In the tests of FIG. 6 the transistor Q was a Texas Instruments TIPL 755A and the diode D was a Varo VHE 620; and in the tests of FIG. 7, Q was a Motorola 2N6547 with the same diode. Both figures show a crossover time when the voltage $V_{CG}$ rises to 10% of peak voltage (about 800 volts) until the time when the collector current $I_C$ falls to 10% of the on-state current (6 to 7 amps) of about 50 to 70 nS. Actual current fall time was of the order of 10 nS—the actual limit of the test instrument itself.

Besides simplicity, the switch of the invention also benefits from low component performance requirements (or perhaps, more accurately, convenient performance requirements).

While it is true that $Q_2$ must have a fast rise time, it does not require a low forward voltage drop, nor does it require a high dissipation capability or high continuous current capacity as in prior circuits. An immediately obvious candidate for this application is the power FET. It is very fast, although no faster than the bipolar switch using the present invention, and can handle very high peak currents with very high current gain. These results are not suitable for emitter-open switching because such suffers from very high on-state losses, and low power dissipation capability. The weaknesses of the FET, fortunately are immaterial for application to the invention. Alternatively, plastic power transistors, such as Motorola MJE 200 or GE D44H series provide highly economical solutions to this need. The MJE 200 was used in the circuit of FIG. 1 for transistors $Q_1$ and $Q_2$ for the above experiments graphed in FIGS. 2 to 5. Despite the high peak current, drive transistor $Q_2$ was only slightly warm, even without the use of a heatsink.

A requirement for the fast recovery diode D is a very low forward voltage drop at high current levels. Fortunately, it does not require a high reverse blocking voltage. Hence Schottky diodes are suitable, although the high junction capacitance may give rise to some ringing problems at turn-off. A Siemens FST200, for example, provides 200 A capability. Forward voltage drop is under 0.7 volts at 200 A. Besides Schottky diodes, there are a proliferation of very high speed diodes which also exhibit very low reverse recovery times (25 to 50 nS) and at the same time have much lower junction capacitance than Schottky diodes. However, their forward voltage drop is slightly higher—0.8 to 0.9 volts at rated current, which is certainly better than the forward voltage drop across the low voltage transistor/FET used for the prior art emitter-open switch, and there certainly is no lack of choice of available devices suitable for the purpose, and with a cost very much lower than the cost of a low voltage switch of equivalent current rating.

The novel semi-conductor switch of the invention is thus both simple and effective and it enables bipolar transistors to switch at the same speeds as FETs, particularly when the comparison is made between high voltage, high current devices of both types. This is interesting because the bipolar solution is much more economical, and can support very high peak voltages at turn-off.

Figure 1A:
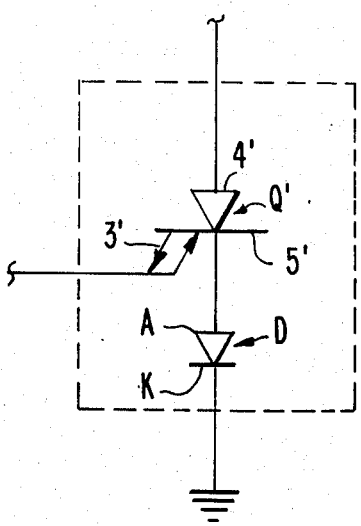

While the invention has been illustrated as applied to a bipolar transistor, clearly other types of semi-conductor switching devices and the like may be similarly employed, including the before-mentioned GTO devices as illustrated in FIG. 1A at Q' with the corresponding electrodes designated 3', 4' and 5'.

As previously pointed out, the use of separate components Q and D inherently introduces undesirable effects such as the inductance $L_P$. The invention can perhaps be more efficiently and satisfactorily implemented by effectively constructing the semi-conductor device inherently to include the diode.

Figure 8:
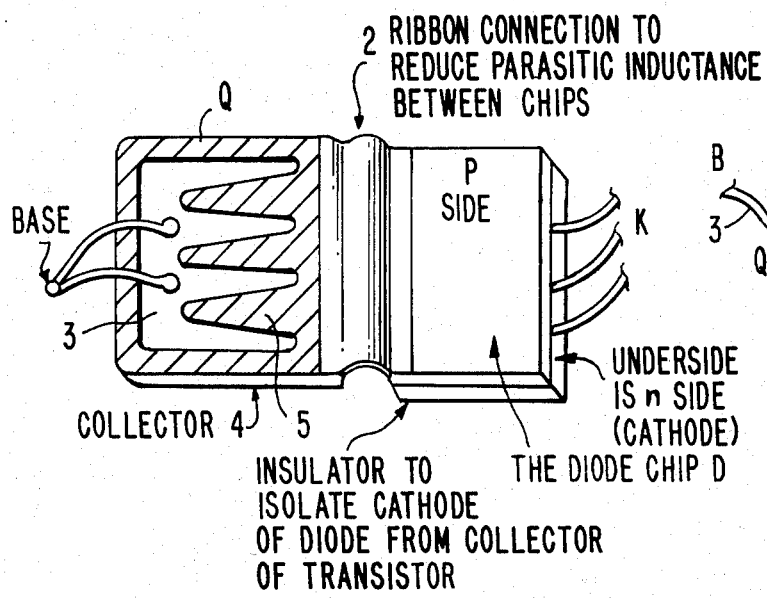
FIG. 8 is an isometric view of a construction that the circuit of FIG. 1 may assume when integrally manufactured.
Figure 9:
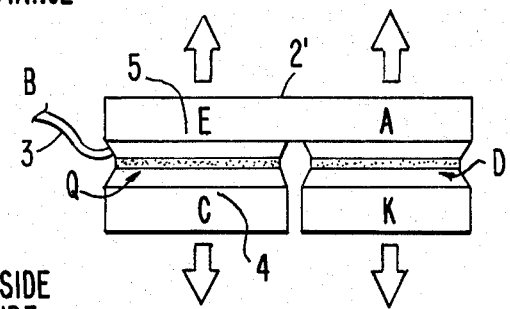
FIGS. 9 and 10 are side elevations of modifications thereof provided with cooling plates for the semiconductor chips.
Figure 10:
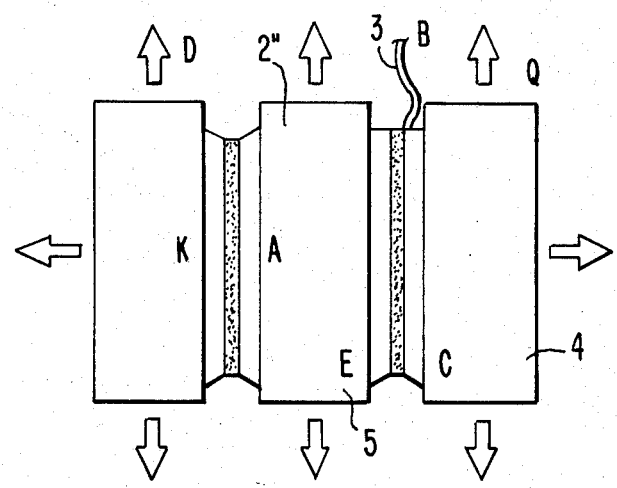

FIG. 8 shows one possible way of manufacturing the switch of the invention as an integral device with present-day chip manufacturing techniques. The switch (transistor/GTO, etc.) chip Q is mounted as close to the diode chip D as possible. A ribbon connector 2 (to reduce inductance) can be used to join the transistor emitter 5 (or GTO cathode, etc.) to the anode (or P side) of the diode D. This assumes single-side cooling. If double-sided cooling is used, as shown in FIG. 9, the ribbon connection 2 can be replaced by a metal cooling plate 2' having an appropriate metal surface (molybdenum, for example) for good thermal cycling. Alternatively, as illustrated in FIG. 10, the Q and D chips may be stacked upon one another, with the anode A of the diode D connected to the emitter 5 by a metal plate 2" of sufficient thickness to serve as a heat sink for lateral dissipation of heat.

Figure 11:
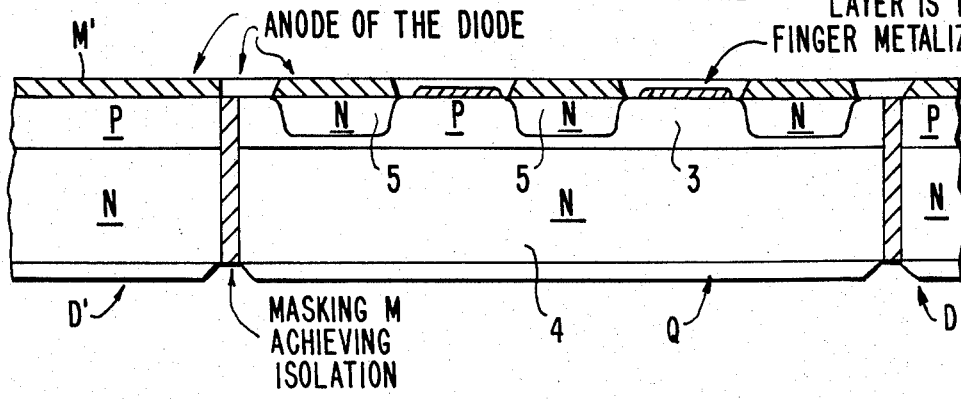

FIG. 11 represents the concept of building the whole switch on a single chip. Some masking or passivation layer M can be used to isolate the diode D from the transistor Q (or GTO, etc.), or dual diodes D–D' at opposite ends of the transistor Q. If the central transistor Q is circular, the diode D–D' may be a concentric ring thereabout eliminating inductive effects. It is suggested that this approach can make full use of the benefit afforded by the presence of the diode to block reverse voltages on the emitter-base junction of the transistor. An analogy can be drawn for the GTO, as well. This means that the emitter 5 of material labelled n can be more heavily doped than normal, providing higher gain and lower saturation voltage. One should, however, make sure that the lateral voltage drop across the base 3 (labelled P material) under the emitter fingers 5, is always less than the emitter-base junction breakdown voltage. The collector N layer is shown at 4, and and the diode region(s) is shown embodying P and N layers, with metallization layers applied across the diode P top surface and the emitter finger regions 5 (n), as at M'. The lower emitter-base junction voltage due to the heavier doping of the emitter n-material 5 can be accompanied by a finer interdigitation correspondingly to reduce the lateral voltage drop across the base under the omitter finger.

FIG. 12A represents another technique for building the reverse base drive transistor $Q_2$ into the common chip, reflecting the need for a very fast reverse base current rise time without substantial parasitic inductance in the feed from the reverse base drive transistor $Q_2$. The monolithic construction of FIGS. 12A and B lends itself to easy fabrication of the reverse base drive transistor $Q_2$ into the base fingers 3 of Q. An alternate approach is to have a separate chip $Q_2$ (or chips) mounted close to Q-D chips, FIG. 12B.

FIGS. 13 to 15 show circuits which will enhance the performance of the new switch of the invention. FIG. 13 shows a 'lossless' turn-on plus turn-off snubber which can help even further to reduce losses in the switch of the invention. FIG. 14 illustrates a 'lossless' turn-on snubber which will help to reduce, for example, the peak current through the switch of the invention when it takes the current over from a free-wheeling diode. FIG. 15 shows one possible way to series-connect switches of the invention for applications requiring higher voltage devices than generally available.

Briefly, the components labelled $C_1$, $C_2$, $L_1$, $L_2$, $D_1$, $D_2$, $D_F$ and $SW_2$ in FIG. 13 constitute a snubber of a substantially lossless turn-on, turn-off circuit which can be used further to reduce losses in the semi-conductor switch Q-D of the invention. When Q is turned off, current through $L_1$ is shunted via $D_1$ and $C_1$ to ground. Voltage across Q will rise at the rate determined by $I_C/C_1$ until the voltage across $C_2$ plus the voltage across $C_1$ equals the supply voltage. The current is then split between $C_1$ and $C_2$ until the energy in $L_1$ is transferred to $C_2$ and $C_1$, ending the turn-off phase. At turn-on, switch $SW_2$ is closed and energy in $C_1$ is transferred to $C_2$ charging it at reverse polarity, thereby resetting snubber for next turn-off, with $L_2$ limiting the peak charge current.

The system in FIG. 14 is another form of lossless snubber embodying an inductance L connected between the collector 4 and the load, which can be used to reduce peak turn-on current of the switch 1 (Q-D); such current arising because of the reverse recovery current $I_{rr}$ of the free-wheeling diode $D_F$. An advantage of this circuit is that the switch $SW_2$ in FIG. 14, which is an SCR, can operate at a lower frequency than the switch 1 (Q-D). Once the voltage across L exceeds the voltage of the zener diode Z, switch $SW_2$ is triggered to discharge C.

The switch 1' in FIG. 15 is a cascade of three serially connected N-P-N transistors Q and a single load diode D. Again, base drive circuits (Bd.) are provided, with a capacitor divider netword C' insuring equal sharing of voltage among the switches Q, with the terminals of C' connected to appropriate power sources. The switch 1' can achieve higher voltage blocking capability than a single bipolar transistor Q.

Further modifications of the invention herein disclosed will occur to persons skilled in the art and all such modifications are deemed to be within the scope of the invention as defined by the appended claims.

What is claimed is:

1. High voltage, high current switching apparatus comprising, in combination: a high voltage, high current switching transistor having a base, an emitter and a collector and which is susceptible to reverse biased secondary breakdown when a reverse bias is applied between the base and emitter to turn off said transistor; base drive means for applying a forward bias voltage between the base and emitter of said transistor to turn on said transistor and for applying a high reverse bias voltage with fast rise time between the base and emitter of said transistor to turn off said transistor; and high current diode means connected between ground and the emitter of said transistor with such a polarity as to permit normal forward current flow through said transistor when said transistor is in an ON state; said high reverse bias voltage applied by said base drive means being sufficient to maintain said diode means in a reverse biased state during turn off of said transistor and thereby to prevent current flow between the collector and emitter of said transistor and force reverse base current in said transistor to a level at least equal to that of collector current in said transistor during turn off of said transistor, whereby reverse biased secondary breakdown of said transistor at turn off by said drive means is eliminated.

2. Apparatus in accordance with claim 1, wherein said diode means comprises a high speed reverse recovery, high current diode.

3. Apparatus in accordance with claim 1, wherein said diode means is connected to the emitter of said transistor through a low inductance connection.

4. Apparatus in accordance with claim 1, wherein said base drive means comprises a pair of voltage sources respectively connected to a pair of switching devices connected to the base of said transistor, said switching devices being alternately conducting in order to connect said voltage sources alternately to the base of said transistor, one of said voltage sources providing said forward bias voltage to turn on said transistor and the other of said voltage sources providing said high reverse bias voltage to turn off said transistor.

5. Apparatus in accordance with claim 4, wherein said switching devices are fast rise time semiconductor switches.

6. Apparatus in accordance with claim 1, wherein said diode means has a low forward voltage drop when in an ON state.

7. Apparatus in accordance with claim 1, wherein said transistor is of a type which is capable of switching currents on the order of amperes and wherein said diode means is of a type which is capable of passing such currents.

8. Apparatus in accordance with claim 1, wherein said transistor is of a type which is capable of switching currents on the order of hundreds of amperes and wherein said diode means is of a type which is capable of passing such currents.

9. Apparatus in accordance with claim 1, wherein said transistor and said diode means are in the form of adjacent chip components and wherein said diode means is connected to the emitter of said transistor switch by metallized connector means.

10. Apparatus in accordance with claim 9, wherein said connector means comprises a metallized layer connecting said diode means to the emitter of said transistor.

11. High voltage, high current switching apparatus comprising, in combination: a high voltage, high current gate-turn-off semiconductor switch having an anode, a cathode and a gate and which is susceptible to reverse biased secondary breakdown when a reverse bias voltage is applied between said gate and said cathode to turn off said switch; gate drive means for applying a forward bias voltage between the gate and cathode of said switch to turn on said switch and for applying a reverse bias voltage with fast rise time between the gate and cathode of said switch to turn off said switch; and high current diode means connected between ground and the cathode of said switch with such a polarity as to permit normal forward current flow through said switch when said switch is in an ON state; said high reverse bias voltage applied by said drive means being sufficient to maintain said diode means in a reverse biased state during turn off of said switch and thereby to prevent current flow between the anode and cathode of said switch and force reverse gate current in said switch to a level at least equal to that of anode current in said switch during turn off of said switch, whereby reverse biased secondary breakdown of said switch at turn off by said gate drive means is eliminated.

12. Apparatus in accordance with claim 11, wherein said diode means comprises a high speed reverse recovery, high current diode.

13. Apparatus in accordance with claim 11, wherein said diode means is connected to the cathode of said switch through a low inductance connection.

14. Apparatus in accordance with claim 11, wherein said gate drive means comprises a pair of voltage sources respectively connected to a pair of switching devices connected to the gate of said switch, said switching devices being alternately conducting in order to connect said voltage sources alternately to the gate of said switch, one of said voltage sources providing said forward bias voltage to turn on said switch and the other of said voltage sources providing said high reverse bias voltage to turn off said switch.

15. Apparatus in accordance with claim 14 wherein said switching devices are fast rise time semiconductor switches.

16. Apparatus in accordance with claim 11, wherein said diode means has a low forward voltage drop when in an ON state.

17. Apparatus in accordance with claim 11, wherein said switch is of a type which is capable of switching currents on the order of amperes and wherein said diode means is of a type which is capable of conducting such currents.

18. Apparatus in accordance with claim 11, wherein said switch is of a type which is capable of switching currents on the order of hundreds of amperes and wherein said diode means is of a type which is capable of passing such currents.

* * * * *